(12) United States Patent
Kim et al.

(10) Patent No.: US 8,461,597 B2
(45) Date of Patent: Jun. 11, 2013

(54) TRANSISTORS, METHODS OF MANUFACTURING A TRANSISTOR, AND ELECTRONIC DEVICES INCLUDING A TRANSISTOR

(75) Inventors: Sun-il Kim, Osan-si (KR); Jae-chul Park, Suwon-si (KR); Sang-wook Kim, Yongin-si (KR); Young-soo Park, Yongin-si (KR); Chang-jung Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 166 days.

(21) Appl. No.: 12/805,648

(22) Filed: Aug. 11, 2010

(65) Prior Publication Data

US 2011/0175080 A1 Jul. 21, 2011

(30) Foreign Application Priority Data

Jan. 15, 2010 (KR) ........................ 10-2010-0003927

(51) Int. Cl.
*H01L 29/786* (2006.01)
(52) U.S. Cl.
USPC ...................... 257/72; 257/E29.296; 438/164
(58) Field of Classification Search
USPC ............................. 257/72, E29.296; 438/164
See application file for complete search history.

(56) References Cited

U.S. PATENT DOCUMENTS

| | | | | |
|---|---|---|---|---|
| 2004/0238886 A1* | 12/2004 | Lee et al. | | 257/347 |
| 2005/0247934 A1* | 11/2005 | Kitakado et al. | | 257/59 |
| 2006/0050192 A1* | 3/2006 | Cho et al. | | 349/42 |
| 2007/0052025 A1 | 3/2007 | Yabuta | | |
| 2007/0114524 A1* | 5/2007 | Oh et al. | | 257/40 |
| 2007/0212827 A1* | 9/2007 | Girotra et al. | | 438/158 |
| 2007/0262308 A1* | 11/2007 | Song | | 257/59 |
| 2008/0237598 A1 | 10/2008 | Nakayama | | |
| 2008/0239189 A1 | 10/2008 | Hatta et al. | | |
| 2009/0184315 A1* | 7/2009 | Lee et al. | | 257/43 |
| 2010/0051949 A1 | 3/2010 | Yamazaki et al. | | |
| 2010/0244022 A1 | 9/2010 | Takahashi et al. | | |
| 2010/0301340 A1* | 12/2010 | Shih et al. | | 257/59 |

FOREIGN PATENT DOCUMENTS

| | | |
|---|---|---|
| EP | 1 976 018 | 10/2008 |
| EP | 2 159 845 | 3/2010 |
| JP | 53-101979 | 9/1978 |
| JP | 06-337399 | 12/1994 |
| JP | 07-147408 | 6/1995 |

(Continued)

OTHER PUBLICATIONS

Search Report dated Jan. 25, 2011, issued in corresponding Application No. EP 10192961.0-1528.

(Continued)

*Primary Examiner* — Steven J Fulk
(74) *Attorney, Agent, or Firm* — Harness, Dickey & Pierce, P.L.C.

(57) ABSTRACT

Transistors, methods of manufacturing a transistor, and electronic devices including a transistor are provided, the transistor includes a channel layer, a source and a drain respectively contacting opposing ends of the channel layer, a gate corresponding to the channel layer, a gate insulating layer between the channel layer and the gate, and a first passivation layer and a second passivation layer sequentially disposed on the gate insulating layer. The first passivation layer covers the source, the drain, the gate, the gate insulating layer and the channel layer. The second passivation layer includes fluorine (F).

23 Claims, 7 Drawing Sheets

FOREIGN PATENT DOCUMENTS

| | | |
|---|---|---|
| JP | 2000-155342 | 6/2000 |
| KR | 1998-065168 | 10/1998 |
| KR | 1998-074495 | 11/1998 |
| KR | 10-2008-0070327 | 7/2008 |
| KR | 10-2008-0073937 | 8/2008 |
| KR | 10-2009-0079686 | 7/2009 |
| WO | WO 2009/093722 | 7/2009 |

OTHER PUBLICATIONS

Y. L. Cheng et al., "Moisture resistance and thermal stability of fluorine-incorporation siloxane-based low-dielectric-constant material," Thin Solid Films, Elsevier-Sequoia S.A. Lausanne, CH, vol. 447-448, Jan. 30, 2004, pp. 681-687, XP004493820.

* cited by examiner

TRANSISTORS, METHODS OF MANUFACTURING A TRANSISTOR, AND ELECTRONIC DEVICES INCLUDING A TRANSISTOR

CROSS-REFERENCE TO RELATED APPLICATION

This application claims the benefit of priority under 35 U.S.C. §119 from Korean Patent Application No. 10-2010-0003927, filed on Jan. 15, 2010, in the Korean Intellectual Property Office, the disclosure of which is incorporated herein in its entirety by reference.

BACKGROUND

1. Field

Example embodiments relate to transistors, methods of manufacturing the transistors, and electronic devices including a transistor.

2. Description of the Related Art

Transistors are widely used as switching devices or driving devices in electronic devices. In particular, because thin film transistors may be formed on glass substrates or plastic substrates, thin film transistors are generally used in the field of flat display devices (e.g., liquid crystal display devices, organic light emitting display devices and the like).

To increase operating characteristics of a transistor, a method of using an oxide layer having a substantially high carrier mobility as a channel layer is performed. This method is generally used to fabricate a thin film transistor for a flat display device.

However, in a transistor (an oxide transistor) having an oxide layer as a channel layer, the oxide layer is sensitive to environment (e.g., light or moisture), and thus characteristics of the transistor may not be constantly maintained.

SUMMARY

Example embodiments relate to transistors, methods of manufacturing the transistors, and electronic devices including a transistor.

Provided are transistors wherein the variation of characteristics due to environment (e.g., light or moisture) is suppressed and methods of manufacturing the transistors.

Additional aspects will be set forth in part in the description which follows and, in part, will be apparent from the description, or may be learned by practice of the presented embodiments.

According to example embodiments, an transistor includes a channel layer including an oxide semiconductor, a source and a drain respectively contacting both (or opposing) ends of the channel layer, a gate corresponding to the channel layer, a gate insulating layer disposed between the channel layer and the gate, a first passivation layer formed to cover the source, the drain, the gate, the gate insulating layer and the channel layer, and a second passivation layer formed on the first passivation layer and including fluorine (F).

The first passivation layer may include at least one selected from the group consisting of a silicon oxide layer, a silicon nitride layer, a silicon oxynitride layer, an organic material layer and combinations thereof. The first passivation layer may not contain fluorine (F).

The second passivation layer may include at least one selected from the group consisting of an F-doped silicon oxide layer, an F-doped silicon nitride layer, an F-doped silicon oxynitride layer and combinations thereof.

The thickness of the first passivation layer may be in a range of about 1000-Å to about 3000-Å. The thickness of the second passivation layer may be in a range of about 100-Å to about 3000-Å.

The oxide semiconductor may include a ZnO-based oxide. The ZnO-based oxide may be a complex oxide. The complex oxide may include at least one element selected from the group consisting of indium (In), aluminum (Al), gallium (Ga), titanium (Ti), tin (Sn), zirconium (Zr), hafnium (Hf), yttrium (Y), tantalum (Ta), chromium (Cr) and combinations thereof.

The gate insulating layer may include at least one layer selected from the group consisting of a silicon oxide layer, a silicon nitride layer, a silicon oxynitride layer, a high-k dielectric material layer and combinations thereof.

The gate insulating layer may include at least one selected from the group consisting of an F-doped silicon oxide layer, an F-doped silicon nitride layer, an F-doped silicon oxynitride layer, an F-doped high-k dielectric material layer and combinations thereof.

The gate may be disposed above the channel layer. Alternatively, the gate may be disposed below the channel layer.

According to example embodiments, an electronic device (e.g., a flat panel display device) includes the transistor.

According to example embodiments, a method of manufacturing an transistor includes forming a channel layer including an oxide semiconductor, forming a source and a drain respectively contacting both (opposing) ends of the channel layer, forming a gate corresponding to the channel layer, forming a gate insulating layer disposed between the channel layer and the gate, forming a first passivation layer to cover the source, the drain, the gate, the gate insulating layer, and the channel layer, and forming a second passivation layer containing fluorine (F) on the first passivation layer.

The first passivation layer may be formed not containing fluorine (F).

The second passivation layer may be formed by performing chemical vapor deposition (CVD) using a reaction gas including a fluorine (F)-containing first gas. The F-containing first gas may include at least one selected from the group consisting of $CF_4$, $SF_6$, $CHF_3$, $F_2$, $C_2F_6$, $NF_3$ and combinations thereof. The reaction gas may further include at least one of a Si-containing second gas and a nitrogen (N)-containing third gas. The silicon (Si)-containing second gas may include at least one selected from the group consisting of $SiF_4$, $SiH_4$, $SiH_2$ and combinations thereof. The nitrogen (N)-containing third gas may include at least one selected from the group consisting of NH3, N2O, N2, NO and combinations thereof.

The fluorine (F)-containing first gas may further include at least one of Si, N or combinations thereof.

The oxide semiconductor may include a ZnO-based oxide. The ZnO-based oxide may be a complex oxide further including at least one element selected from the group consisting of indium (In), aluminum (Al), gallium (Ga), titanium (Ti), tin (Sn), zirconium (Zr), hafnium (Hf), yttrium (Y), tantalum (Ta), chromium (Cr) and combinations thereof.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
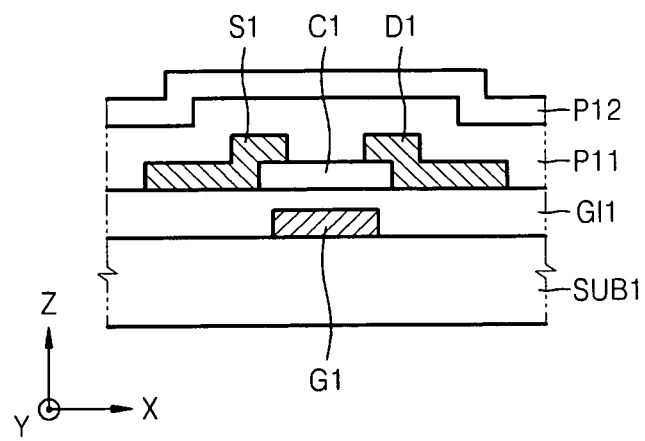
FIG. 1 is a cross-sectional view of a transistor according to example embodiments.

Various example embodiments will now be described more fully with reference to the accompanying drawings in which example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a transistor according to example embodiments, a method of manufacturing the transistor, and an electronic device including a transistor will be described in more detail with reference to the accompanying drawings. In the drawings, the widths and thicknesses of layers and regions are exaggerated for clarity. Like reference numerals in the drawings denote like elements.

Example embodiments relate to transistors, methods of manufacturing the transistors, and electronic devices including a transistor.

FIG. 1 is a cross-sectional view of a transistor according to example embodiments.

Figure 5:
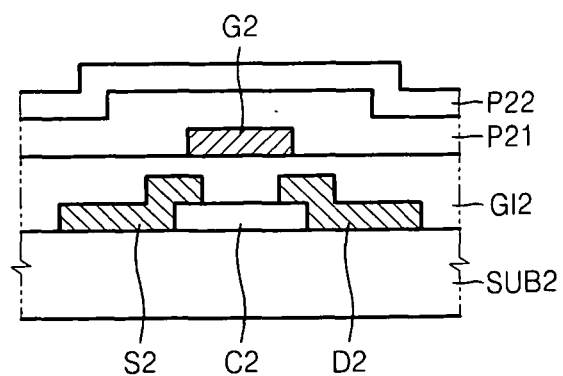
FIG. 5 is a cross-sectional view of a transistor according to example embodiments.

The transistor shown in FIG. 1 is a bottom-gate thin film transistor in which a gate G1 is formed below a channel layer C1. However, example embodiments are not limited thereto. For example, the transistor may be a top-gate thin film transistor, as shown in FIG. 5.

Referring to FIG. 1, the gate G1 may be formed on a substrate SUB1. The substrate SUB1 may be a glass substrate or any other substrate generally used in a semiconductor device. For example, the substrate SUB1 may be a plastic substrate or a silicon substrate. The gate G1 may be formed of a metal (e.g., copper (Cu), titanium (Ti), molybdenum (Mo), aluminum (Al), nickel (Ni), tungsten (W), platinum (Pt), chromium (Cr) or combinations thereof), or a conductive oxide (e.g., indium zinc oxide (IZO), indium tin oxide (ITO) or combinations thereof). Alternatively, the gate G1 may have a multi-layered structure including a plurality of different material layers, or may be formed of an alloy of at least two metals.

Although not illustrated in FIG. 1, an insulating layer may be disposed between the substrate SUB1 and the gate G1. The insulating layer may be formed on the substrate SUB1, and then the gate G1 may be formed on the insulating layer. The insulating layer may be a thermal oxide layer.

A gate insulating layer GI1 may be formed on the substrate SUB1 to cover the gate G1. The gate insulating layer GI1 may be a silicon oxide layer, a silicon nitride layer, a silicon oxynitride layer or another material layer (e.g., a high-k dielectric material layer having a larger dielectric constant than the silicon nitride layer). The gate insulating layer GI1 may have a multi-layered structure. For example, the gate insulating layer GI1 may have a multi-layered structure in which the silicon nitride layer and the silicon oxide layer are sequentially stacked. Alternatively, the gate insulating layer GI1 may have a single- or multi-layered structure including at least one layer selected from the group consisting of a fluorine (F)-doped silicon oxide layer, an F-doped silicon nitride layer, an F-doped silicon oxynitride layer, an F-doped high-k dielectric material layer and combinations thereof.

A channel layer C1 may be formed on the gate insulating layer GI1. The channel layer C1 may be disposed above the gate G1. The width of the channel layer C1 in the x-axis direction may be relatively greater than the width of the gate G1 in the x-axis direction. The channel layer C1 may be formed of an oxide semiconductor (e.g., a ZnO-based oxide semiconductor). In this regard, the ZnO-based oxide semiconductor may be a complex oxide. The complex oxide may include at least one element selected from the group consisting of a Group III element (e.g., indium (In), aluminum (Al), gallium (Ga) or combinations thereof), a Group IV element (e.g., titanium (Ti), tin (Sn), zirconium (Zr), hafnium (Hf) or combinations thereof), and other elements (e.g., yttrium (Y), tantalum (Ta) or chromium (Cr)). The oxide semiconductor may be amorphous or crystalline, or a mixture of amorphous and crystalline.

A source electrode S1 and a drain electrode D1 may be disposed on the gate insulating layer GI1. The source electrode 51 and the drain electrode D1 may contact both (or opposing) ends of the channel layer C1, respectively. The source electrode S1 and the drain electrode D1 may be a single metal layer or multiple metal layers. Each of the source electrode S1 and the drain electrode D1 may be formed of a metal (e.g., copper (Cu), titanium (Ti), molybdenum (Mo), aluminum (Al), nickel (Ni), tungsten (W), platinum (Pt), chromium (Cr) or combinations thereof), or a conductive oxide (e.g., IZO, ITO or combinations thereof). Alternatively, the source electrode S1 and the drain electrode D1 may have a multi-layered structure including a plurality of different material layers, or may be formed of an alloy of at least two metals. The source electrode S1 and the drain electrode D1 may be a material layer that is the same as, or different from, the gate G1.

The thicknesses of the gate G1, the gate insulating layer GI1, the source electrode S1 and the drain electrode D1 may be in a range of about 50-nm to about 300-nm, about 50-nm to about 400-nm, about 10-nm to about 200-nm, and about 10-nm to about 200-nm, respectively.

A first passivation layer P11 may be formed on the gate insulating layer GI1 to cover the channel layer C1, the source electrode S1 and the drain electrode D1. The first passivation layer P11 may be a silicon oxide layer, a silicon nitride layer, a silicon oxynitride layer, an organic material layer or combinations thereof. The first passivation layer P11 may have a stacked structure of at least two layers thereof. The first passivation layer P11 may have a thickness in a range of about 1000 Å to about 3000 Å. The first passivation layer P11 may not include fluorine (F).

A second passivation layer P12 may be formed on the first passivation layer P11. The second passivation layer P12 may be an F-containing layer. For example, the second passivation layer P12 may have a single- or multi-layered structure including at least one layer selected from the group consisting of an F-doped silicon oxide layer, an F-doped silicon nitride layer, an F-doped silicon oxynitride layer and combinations thereof. The second passivation layer P12 may have a thickness in a range of about 100 Å to about 3000 Å.

Variations in characteristics of the channel layer C1 due to environment may be suppressed, or decrease, by the second passivation layer P12 containing fluorine (F), and the reliability of the transistor may be enhanced, accordingly. More particularly, the second passivation layer P12 including at least one of the F-doped silicon oxide layer, the F-doped silicon nitride layer and the F-doped silicon oxynitride layer effectively prevents moisture, hydrogen or an OH radical from permeating into a lower structure (e.g., the channel layer C1 and the like) from external air, whereby the reliability of the transistor may increases.

The first passivation layer P11 may prevent the source electrode S1 and the drain electrode D1 from being damaged by an F-containing gas used to form the second passivation layer P12. If the transistor does not include the first passivation layer P11, the source electrode S1 and the drain electrode D1 may be damaged (e.g., during etching), whereby characteristics of the transistor may be deteriorated. Because the first passivation layer P11 that does not contain fluorine (F) is formed more rapidly than the second passivation layer P12 that contains F, the first passivation layer P11 may increase the processing speed of the transistor.

Hereinafter, a method of manufacturing a transistor according to example embodiments of the present invention will be described.

FIGS. 2A through 2G are cross-sectional views sequentially illustrating a method of manufacturing a transistor according to example embodiments.

Like reference numerals denote like elements in FIG. 1 and FIGS. 2A through 2G.

Figure 2A:
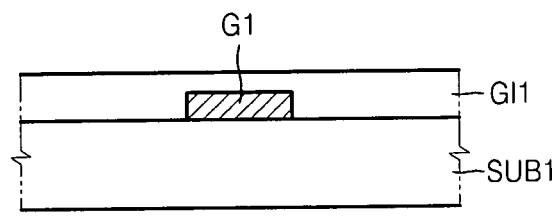
FIGS. 2A through 2G are cross-sectional views sequentially illustrating a method of manufacturing a transistor according to example embodiments.

Referring to FIG. 2A, an electrode material layer may be formed on a substrate SUB1, and then patterned to form a gate G1. The substrate SUB1 may be a glass substrate or any other substrate generally used in a semiconductor device. For example, the substrate SUB1 may be a plastic substrate or a silicon substrate. The gate G1 may be formed of a metal (e.g., Cu, Ti, Mo, Al, Ni, W, Pt, Cr or combinations thereof), or a conductive oxide (e.g., IZO, ITO or combinations thereof). Alternatively, the gate G1 may have a multi-layered structure including a plurality of different material layers, or may be formed of an alloy of at least two metals. An insulating layer (not shown) may be formed on the substrate SUB1, and the gate G1 may be formed on the insulating layer. The insulating layer may be a thermal oxide layer.

A gate insulating layer GI1 may be formed to cover the gate G1. The gate insulating layer GI1 may be a silicon oxide layer, a silicon nitride layer, a silicon oxynitride layer or another material layer (e.g., a high-k dielectric material layer having a larger dielectric constant than the silicon nitride layer). The gate insulating layer GI1 may have a multi-layered structure including at least two different material layers. For example, the gate insulating layer GI1 may have a multi-layered structure in which the silicon nitride layer and the silicon oxide layer are sequentially stacked. Alternatively, the gate insulating layer GI1 may have a single- or multi-layered structure including at least one layer selected from the group consisting of an F-doped silicon oxide layer, an F-doped silicon nitride layer, an F-doped silicon oxynitride layer, an F-doped high-k dielectric material layer or a combination thereof.

Figure 2B:
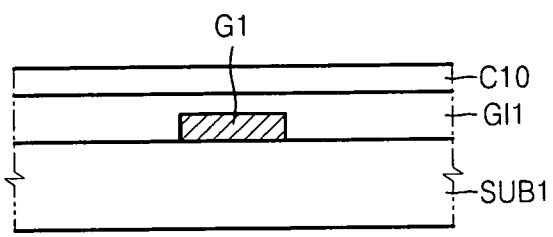

Referring to FIG. 2B, an oxide layer C10 for a channel may be formed on the gate insulating layer GI1. The oxide layer C10 may be deposited by physical vapor deposition (PVD) (e.g., sputtering, evaporation or the like), or by chemical vapor deposition (CVD). The oxide layer C10 may include a ZnO-based oxide semiconductor. The ZnO-based oxide semiconductor may be a complex oxide further including at least one element selected from the group consisting of a Group III element (e.g., In, Al, Ga or combinations thereof), a Group IV element (e.g., Ti, Sn, Zr, Hf or combinations thereof), and other elements (e.g., Y, Ta, Cr or combinations thereof).

Figure 2C:
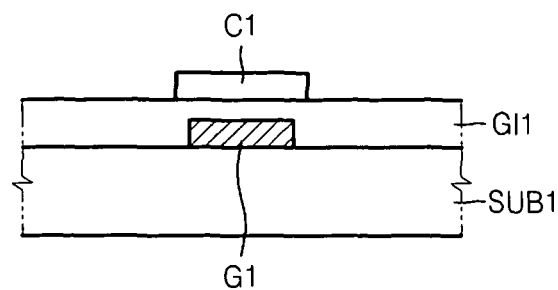

The oxide layer C10 may be patterned to form a channel layer C1 as illustrated in FIG. 2C. The channel layer C1 may be disposed above the gate G1.

Figure 2D:
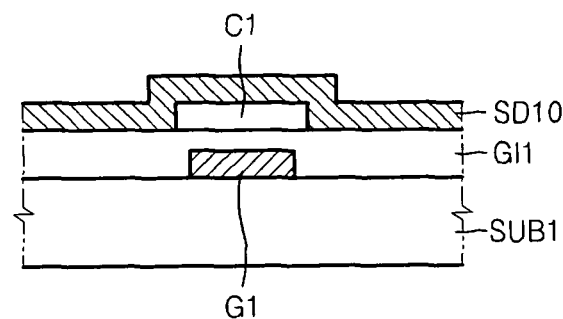

Referring to FIG. 2D, a source/drain electrode material layer SD10 may be formed on the gate insulating layer GI1 to cover the channel layer C1. The source/drain electrode material layer SD10 may have a single- or multi-layered structure including at least one conductive material selected from the group consisting of a metal (e.g., Cu, Ti, Mo, Al, Ni, W, Pt, Cr or combinations thereof), a conductive oxide (e.g., IZO, ITO or combinations thereof), and alloys thereof. The source/drain electrode material layer SD10 may be formed of a material that is the same as, or different from, that of the gate G1.

Figure 2E:
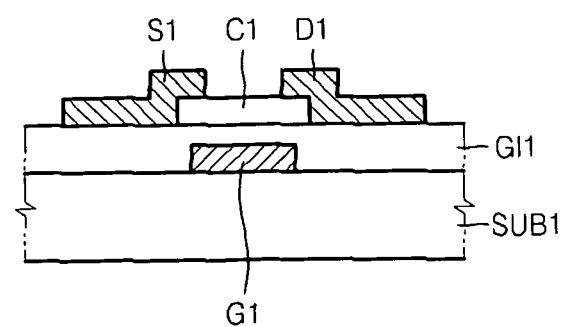

The source/drain electrode material layer SD10 may be patterned to form a source electrode S1 and a drain electrode D1 that respectively contact both (or opposing) ends of the channel layer C1, as illustrated in FIG. 2E. In this regard, a portion of the channel layer C1 may be exposed between the source electrode S1 and the drain electrode D1.

Figure 2F:
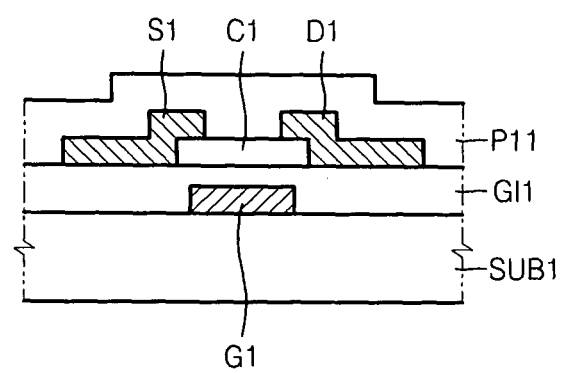

Referring to FIG. 2F, a first passivation layer P11 may be formed on the gate insulating layer GI1 to cover the exposed portion of the channel layer C1, the source electrode S1 and the drain electrode D1. The first passivation layer P11 may have a single- or multi-layered structure including at least one material selected from a silicon oxide, a silicon nitride, a silicon oxynitride, an organic material and combinations thereof. The first passivation layer P11 may have a thickness in a range of about 1000 Å to about 3000 Å.

Figure 2G:
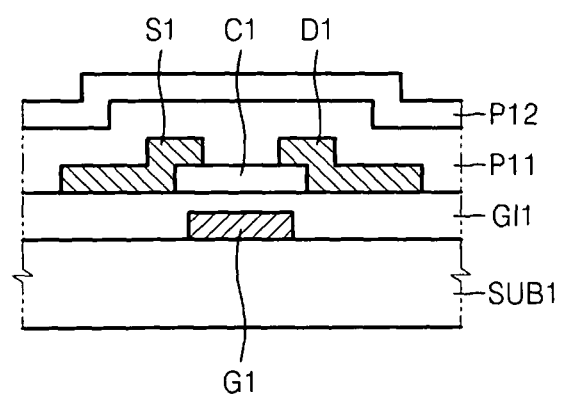

Referring to FIG. 2G, a second passivation layer P12 may be formed on the first passivation layer P11. The second passivation layer P12 may contain fluorine (F). For example, the second passivation layer P12 may have a single- or multi-layered structure including at least one layer selected from the group consisting of an F-doped silicon oxide layer, an F-doped silicon nitride layer, an F-doped silicon oxynitride layer and combinations thereof. The second passivation layer P12 may be formed by CVD using a reaction gas including an F-containing first gas. The reaction gas may include at least one of a Si-containing second gas, an N-containing third gas and combinations thereof. Alternatively, the F-containing first gas may include at least one of Si, N and combinations thereof. The reaction gas may include the F-containing first gas and another gas including both silicon (Si) and nitrogen (N). In other words, the second passivation layer P12 may be formed using the F-containing first gas, the Si-containing second gas, the N-containing third gas, or a gas containing at least two of F, Si and N. The F-containing first gas may be $CF_4$, $SF_6$, $CHF_3$, $F_2$, $C_2F_6$ $NF_3$ gas or combinations thereof, the Si-containing second gas may be $SiF_4$, $SiH_4$, $SiH_2$ gas or combinations thereof, and the N-containing third gas may be $NH_3$, $N_2O$, $N_2$, NO gas or combinations thereof. In this regard, the $SiF_4$ gas contains both Si and F. The reaction gas may further include a carrier gas or other gases (e.g., oxygen gas or the like). The second passivation layer P12 may have a thickness in a range of about 100 Å to about 3000 Å.

An F-containing passivation material is capable of effectively preventing (or reducing) permeation of moisture, hydrogen or an OH radical compared with an F-free (containing no fluorine) passivation material. The second passivation layer P12 that contains F may prevent moisture, hydrogen or an OH radical from permeating into the channel layer C1, or minimizing the permeation thereof, whereby the reliability of the transistor may increase. The first passivation layer P11 may prevent the source electrode S1 and the drain electrode D1 from being damaged (e.g., during etching) by the F-containing gas used to form the second passivation layer P21.

The transistor manufactured using the method as described above may be annealed at a temperature in a range of about 200° C. to about 400° C. The concentration of a carrier in the channel layer C1 may be controlled by the annealing process, and defects existing in the channel layer C1 or between the channel layer C1 and the gate insulating layer GI1 may be removed.

Hereinafter, a method of manufacturing a transistor will be particularly described with reference to an experimental example.

An oxide thin film transistor having a structure as illustrated in FIG. 1 was manufactured as follows. A silicon oxide layer having a thickness of about 2000 Å was used as the first passivation layer P11, and an F-doped silicon oxide layer having a thickness of about 300 Å was used as the second passivation layer P12. In this regard, the second passivation layer P12 was formed by CVD by using a mixed gas of $SiF_4$ and $O_2$ as the reaction gas. An Hf-doped InZnO layer (hereinafter, referred to as "HIZO layer") was used as the channel layer C1.

Figure 3:
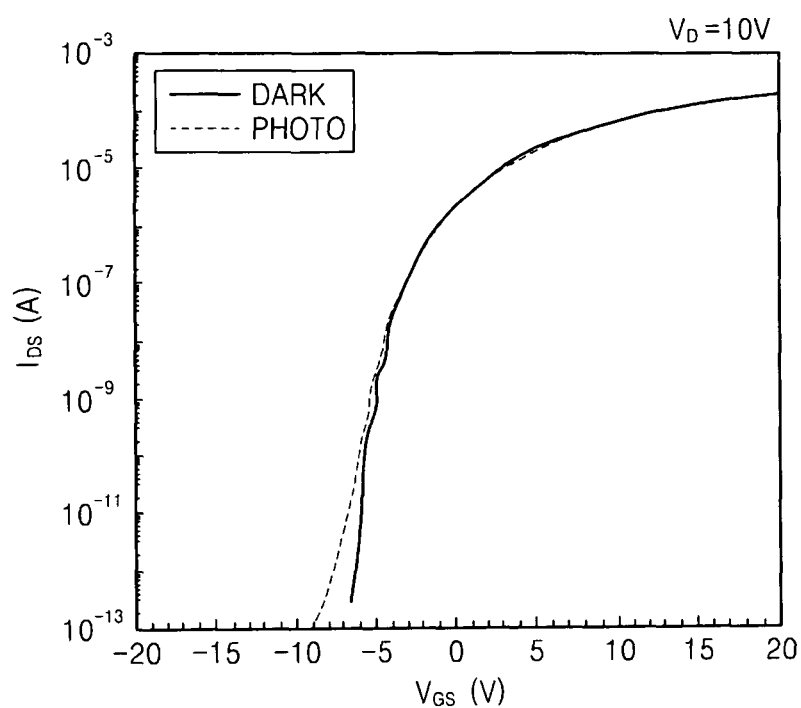
FIG. 3 is a graph showing variations, due to light irradiation, in gate voltage ($V_{GS}$)-drain current ($I_{DS}$) characteristics of a transistor according to example embodiments.
Figure 4:
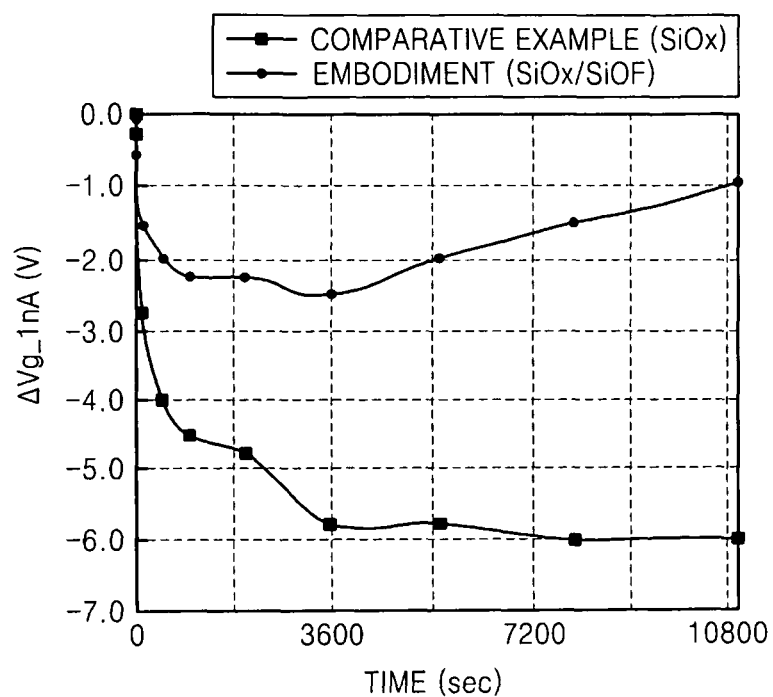
FIG. 4 is a graph showing variations ("$\Delta Vg\_1nA$"), due to light irradiation and voltage stress, in characteristics of a transistor according to example embodiments and a transistor according to a comparative example.

FIGS. 3 and 4 show the evaluation results of reliability with respect to light of the transistor according to the previous experimental example.

FIG. 3 is a graph showing variations, due to light irradiation (before and after light is irradiated), in gate voltage ($V_{GS}$)-drain current ($I_{DS}$) characteristics of a transistor according to the previous experimental example.

In FIG. 3, 'Dark' represents when light is not irradiated, and 'Photo' represents when a light of about 20000 nit is irradiated.

Referring to FIG. 3, a $V_{GS}$–$I_{DS}$ curve of when light is irradiated is almost the same as a $V_{GS}$–$I_{DS}$ curve of when light is not irradiated. This indicates that there is almost no variation in characteristics of the transistor due to light irradiation.

FIG. 4 is a graph showing variations ("ΔVg_1nA"), due to light irradiation and voltage stress, in characteristics of the transistor according to the previous experimental example and a transistor according to a comparative example.

The transistor according to the comparative example has a single passivation layer formed of a silicon oxide. Except for the passivation layer, the transistor according to the comparative example has the same structure as that of the transistor according to the experimental example. The reliability with respect to light and voltage stress of each transistor of FIG. 4 was evaluated by measuring variations ("ΔVg_1nA") in characteristics of each transistor in such a way that a light of about 20000 nit was irradiated to each transistor, and voltages of −20 V, 10 V, and 0 V are respectively applied to a gate, a drain electrode, and a source electrode at the same time. "ΔVg_1nA" denotes a difference between 'Vg_1nA' before and after light and voltage stress is applied (i.e., [Vg_1nA$_{after}$−Vg_1nA$_{before}$]). In this regard, 'Vg_1nA' denotes a gate voltage allowing a current of 1 nA to flow between source and drain electrodes.

In FIG. 4, time (in seconds) denotes periods of time of light irradiation and application of voltage stress. When time is 0, the graph shows measurement results of variations in characteristics of each transistor before light and voltage stress is applied. The evaluation of the reliability with respect to light and voltage stress was performed at room temperature. The larger the variation in "Vg_1nA", the greater the variation in characteristics of the transistor due to light irradiation.

Referring to FIG. 4, the transistor according to the experimental example, which includes a passivation layer having a double layer structure formed of a silicon oxide layer and an F-doped silicon oxide layer, has a lower variation in 'Vg_1nA' than the transistor according to the comparative example, which includes a single-layered passivation layer formed of a silicon oxide. For the transistor according to the experimental example, variations in characteristics (e.g., variation in threshold voltage) of the transistor due to light irradiation are substantially small even under voltage stress. Thus, the transistor according to example embodiments has increased reliability with respect to light and voltage stress.

FIG. 5 is a cross-sectional view of a transistor according to example embodiments.

The transistor shown in FIG. 5 is a top-gate thin film transistor in which a gate G2 is formed above a channel layer C2. However, example embodiments are not limited thereto. For example, the transistor may be a bottom-gate thin film, as shown in FIG. 1.

Referring to FIG. 5, the channel layer C2 may be formed on a substrate SUB2. A source electrode S2 and a drain electrode D2 may be formed on the substrate SUB2. The source electrode S2 and the drain electrode D2 may contact both (opposing) ends of the channel layer C2, respectively. A gate insulating layer GI2 may be formed on the substrate SUB2 to cover the channel layer C2, the source electrode S2 and the drain electrode D2. A gate G2 may be formed on the gate insulating layer GI2. The gate G2 may be disposed above the channel layer C2. A first passivation layer P21 may be formed on the gate insulating layer GI2 to cover the gate G2. The second passivation layer P22 may be formed on the first passivation layer P21. The materials and thicknesses of the substrate SUB2, the channel layer C2, the source electrode S2, the drain electrode D2, the gate insulating layer GI2, the gate G2, the first passivation layer P21 and the second passivation layer P22 of FIG. 5 may be respectively the same as, or similar to, those of the substrate SUB1, the channel layer C1, the source electrode S1, the drain electrode D1, the gate insulating layer GI1, the gate G1, the first passivation layer P11 and the second passivation layer P12.

FIGS. 6A through 6E are cross-sectional views sequentially illustrating a method of manufacturing a transistor according to example embodiments.

Like reference numerals denote like elements in FIG. 5 and FIGS. 6A through 6E.

Figure 6A:
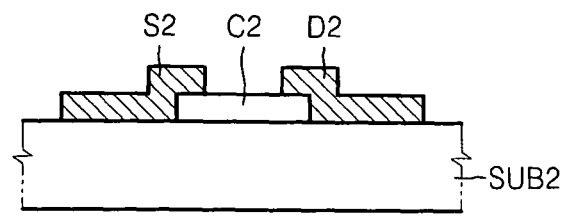
FIGS. 6A through 6E are cross-sectional views sequentially illustrating a method of manufacturing a transistor according to example embodiments.

Referring to FIG. 6A, a channel layer C2 may be formed on a substrate SUB2. The channel layer C2 may be formed of a material that is the same as that of the channel layer C1 of FIG. 2C and using the same method used to form the channel layer C1 of FIG. 2C. A source electrode S2 and a drain electrode D2 may be formed on the substrate SUB2 to respectively contact both (opposing) ends of the channel layer C2.

Figure 6B:
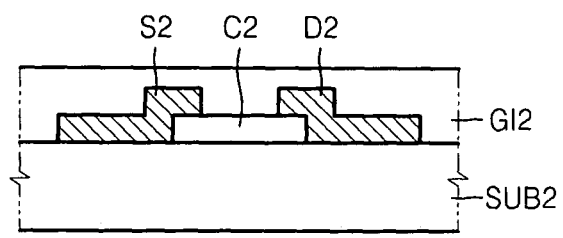

Referring to FIG. 6B, a gate insulating layer GI2 may be formed on the substrate SUB2 to cover an exposed portion of the channel layer C2, the source electrode S2 and the drain electrode D2. The gate insulating layer GI2 may have a single- or multi-layered structure including at least one layer selected from the group consisting of a silicon oxide layer, a silicon nitride layer, a silicon oxynitride layer, a high-k dielectric material layer and combinations thereof. The gate insulating layer GI2 may be formed of at least one material selected from the group consisting of an F-doped silicon oxide, an F-doped silicon nitride, an F-doped silicon oxynitride, an F-doped high-k dielectric material and combinations thereof.

Figure 6C:
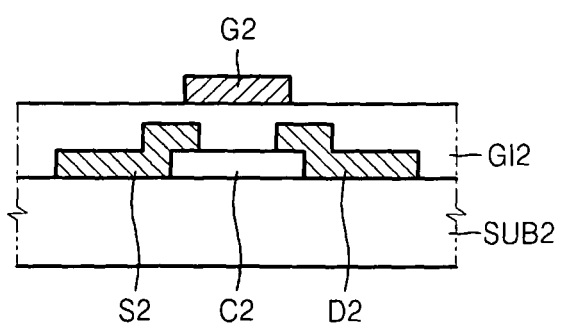

Referring to FIG. 6C, a gate G2 may be formed on the gate insulating layer GI2. The gate G2 may be formed above the channel layer C2.

Figure 6D:
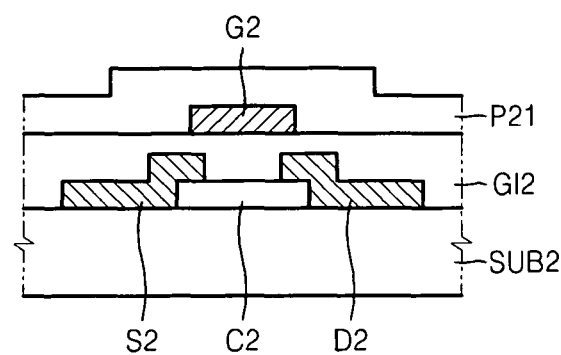

Referring to FIG. 6D, a first passivation layer P21 may be formed on the gate insulating layer GI2 to cover the gate G2. The first passivation layer P21 may be formed of a material that is the same as that of the first passivation layer P11 of FIG. 2F. The first passivation layer P21 may have a thickness in a range of about 1000-Å to about 3000-Å. The first passivation layer P21 may be formed without (or excluding) fluorine (F).

Figure 6E:
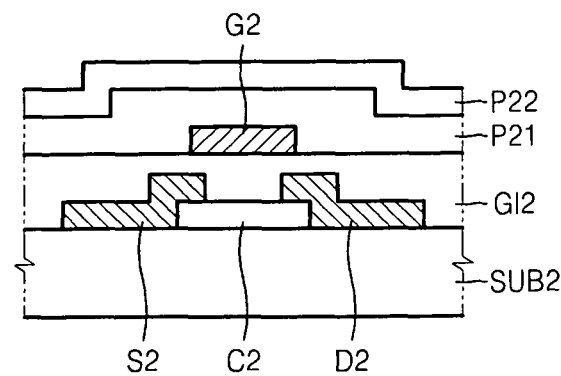

Referring to FIG. 6E, a second passivation layer P22 that contains fluorine (F) may be formed on the first passivation layer P21. The second passivation layer P22 may be formed using a method that is the same as (or similar to) the method of forming the second passivation layer P12 as described in FIG. 2G. For example, the second passivation layer P22 may have a single- or multi-layered structure including at least one material selected from the group consisting of an F-doped silicon oxide, an F-doped silicon nitride, an F-doped silicon oxynitride and combinations thereof.

The second passivation layer P22 may be formed by CVD using a reaction gas including an F-containing first gas. The reaction gas may include at least one of a Si-containing second gas and an N-containing third gas. Alternatively, the F-containing first gas may include at least one of Si and N. The reaction gas may include the F-containing first gas and another gas including both Si and N. In other words, the second passivation layer P12 may be formed using the F-containing first gas, the Si-containing second gas, the N-containing third gas, or a gas containing at least two of F, Si and N. The F-containing first gas may be $CF_4$, $SF_6$, $CHF_3$, $F_2$, $C_2F_6$, $NF_3$ gas or combinations thereof, the Si-containing second gas may be $SiF_4$, $SiH_4$, $SiH_2$ gas or combinations thereof, and the N-containing third gas may be $NH_3$, $N_2O$, $N_2$, NO gas or combinations thereof. In this regard, the $SiF_4$ gas contains both Si and F. The reaction gas may further include a carrier gas or other gases (e.g., oxygen gas or the like). The second passivation layer P22 may have a thickness in a range of about 100 Å to about 3000 Å.

The transistor manufactured using the method as described above may be annealed at a given temperature. Conditions for the annealing process may be the same as described in FIG. 2G.

A transistor according to example embodiments may be used as a switching device, or a driving device, in flat panel display devices (e.g., liquid crystal display devices, organic light emitting display devices or similar devices). As described above, according to example embodiments, variations in characteristics of a transistor due to light are negligible or not present. As such, when the transistor is applied to flat panel display devices, reliability of the flat panel display devices may increase. The structures of the liquid crystal display devices and organic light emitting display devices are well-known, and thus a detailed description thereof is not provided herein. The transistor may also be applied for various applications to other electronic devices (e.g., memory devices, logic devices and the like).

It should be understood that the example embodiments described therein should be considered in a descriptive sense only and not for purposes of limitation. For example, it is understood by those of ordinary skill in the art to which the present invention pertains that the elements and structures of the transistors of FIGS. 1 and 5 may be variously changed. The transistor may have a double-gate structure, and include a channel layer having a multi-layered structure including at least two layers. The source and drain electrodes may respectively contact both (opposing) ends of a bottom surface of the channel layer, not both ends of a top surface of the channel layer. The method of manufacturing a transistor as described in FIGS. 2A through 2G and FIGS. 6A through 6E may be variously changed. Descriptions of features or aspects within each embodiment should typically be considered as available for other similar features or aspects in other embodiments.

Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A transistor, comprising:
    a channel layer including an oxide semiconductor;
    a source and a drain respectively contacting opposing ends of the channel layer;
    a gate corresponding to the channel layer;
    a gate insulating layer between the channel layer and the gate;
    a first passivation layer covering the source, the drain, the gate, the gate insulating layer and the channel layer, wherein fluorine (F) is excluded from the first passivation layer; and
    a second passivation layer including fluorine (F) on the first passivation layer, wherein the second passivation layer directly contacts all of the upper surface of the first passivation layer, and the first passivation layer is interposed between the second passivation layer and the source and the drain.

2. The transistor of claim 1, wherein the oxide semiconductor includes a ZnO-based oxide.

3. The transistor of claim 2, wherein the ZnO-based oxide is a complex oxide including at least one element selected from the group consisting of indium (In), aluminum (Al), gallium (Ga), titanium (Ti), tin (Sn), zirconium (Zr), hafnium (Hf), yttrium (Y), tantalum (Ta), chromium (Cr) and combinations thereof.

4. The transistor of claim 1, wherein the first passivation layer includes at least one selected from the group consisting of a silicon oxide layer, a silicon nitride layer, a silicon oxynitride layer, an organic material layer and combinations thereof.

5. The transistor of claim 1, wherein the second passivation layer includes at least one selected from the group consisting of an F-doped silicon oxide layer, an F-doped silicon nitride layer, an F-doped silicon oxynitride layer and combinations thereof.

6. The transistor of claim 1, wherein the first passivation layer has a thickness in a range of about 1000-Å to about 3000-Å.

7. The transistor of claim 1, wherein the second passivation layer has a thickness in a range of about 100-Å to about 3000-Å.

8. The transistor of claim 1, wherein the gate insulating layer includes at least one layer selected from the group consisting of a silicon oxide layer, a silicon nitride layer, a silicon oxynitride layer, a high-k dielectric material layer and combinations thereof.

9. The transistor of claim 1, wherein the gate insulating layer includes at least one selected from the group consisting of an F-doped silicon oxide layer, an F-doped silicon nitride layer, an F-doped silicon oxynitride layer, an F-doped high-k dielectric material layer and combinations thereof.

10. The transistor of claim 1, wherein the gate is above the channel layer.

11. The transistor of claim 1, wherein the gate is below the channel layer.

12. A flat panel display device, comprising: the transistor according to claim 1.

13. The transistor of claim 1, wherein the second passivation layer and the channel layer do not contact each other.

14. A method of manufacturing a transistor, the method comprising:
    forming a channel layer including an oxide semiconductor;
    forming source and drain respectively contacting opposing ends of the channel layer;
    forming a gate corresponding to the channel layer;
    forming a gate insulating layer between the channel layer and the gate;
    forming a first passivation layer that covers the source, the drain, the gate, the gate insulating layer and the channel layer, wherein fluorine (F) is excluded from the first passivation layer; and
    forming a second passivation layer containing fluorine (F) on the first passivation layer, wherein the second passivation layer directly contacts all of the upper surface of the first passivation layer, and the first passivation layer is interposed between the second passivation layer and the source and the drain.

15. The method of claim 14, wherein the oxide semiconductor includes a ZnO-based oxide.

16. The method of claim 15, wherein the ZnO-based oxide is a complex oxide including at least one element selected from the group consisting of indium (In), aluminum (Al), gallium (Ga), titanium (Ti), tin (Sn), zirconium (Zr), hafnium (Hf), yttrium (Y), tantalum (Ta), chromium (Cr) and combinations thereof.

17. The method of claim 14, wherein forming the second passivation layer includes performing a chemical vapor deposition (CVD) method using a reaction gas including a fluorine (F)-containing first gas.

18. The method of claim 17, wherein the F-containing first gas includes at least one selected from the group consisting of $CF_4$, $SF_6$, $CHF_3$, $F_2$, $C_2F_6$, $NF_3$ and combinations thereof.

19. The method of claim 17, wherein the reaction gas further includes at least one of a silicon (Si)-containing second gas and a nitrogen (N)-containing third gas.

20. The method of claim 19, wherein the Si-containing second gas includes at least one selected from the group consisting of $SiF_4$, $SiH_4$, $SiH_2$ and combinations thereof.

21. The method of claim 19, wherein the N-containing third gas includes at least one selected from the group consisting of $NH_3$, $N_2O$, $N_2$, NO and combinations thereof.

22. The method of claim 17, wherein the F-containing first gas includes at least one of silicon (Si), nitrogen (N) and combinations thereof.

23. The method of claim 14, wherein the second passivation layer and the channel layer do not contact each other.

* * * * *